US012785708B2

(12) United States Patent
Qin

(10) Patent No.: US 12,785,708 B2
(45) Date of Patent: Nov. 3, 2026

(54) TIME-INTERLEAVED ADC MISMATCH CORRECTION METHOD AND TIME-INTERLEAVED ADC

(71) Applicant: Chengdu Sino Microelectronics Technology Co., Ltd., Chengdu (CN)

(72) Inventor: Ling Qin, Chengdu (CN)

(73) Assignee: Chengdu Sino Microelectronics Technology Co., Ltd., Chengdu (CN)

( * ) Notice: Subject to any disclaimer, the term of this patent is extended or adjusted under 35 U.S.C. 154(b) by 157 days.

(21) Appl. No.: 19/012,896

(22) Filed: Jan. 8, 2025

(65) Prior Publication Data

US 2025/0337423 A1 Oct. 30, 2025

(30) Foreign Application Priority Data

Apr. 30, 2024 (CN) ........................ 202410534724.8

(51) Int. Cl.
*H03M 1/06* (2006.01)
*H03M 1/12* (2006.01)

(52) U.S. Cl.
CPC ....... *H03M 1/0626* (2013.01); *H03M 1/1215* (2013.01)

(58) Field of Classification Search
None
See application file for complete search history.

(56) References Cited

U.S. PATENT DOCUMENTS

| | | | | |
|---|---|---|---|---|
| 7,741,982 B2 * | 6/2010 | Johansson | H03M 1/0836 | 341/120 |
| 9,287,889 B2 * | 3/2016 | Chiu | H03M 1/0836 | |
| 9,294,112 B1 * | 3/2016 | Devarajan | H03M 1/0836 | |
| 9,369,142 B2 * | 6/2016 | Qiu | H03M 1/0631 | |
| 9,806,732 B1 * | 10/2017 | Khoshgard | H03M 1/1038 | |
| 11,552,646 B2 * | 1/2023 | Bal | H03M 1/0624 | |
| 2010/0164763 A1 * | 7/2010 | Kidambi | H03M 1/1028 | 341/118 |
| 2013/0069812 A1 * | 3/2013 | Waltari | H03M 1/0626 | 341/166 |
| 2014/0022101 A1 * | 1/2014 | Hovakimyan | H03M 1/0612 | 341/118 |

(Continued)

*Primary Examiner* — Lam T Mai
(74) *Attorney, Agent, or Firm* — Central California IP Group, P.C.; Andrew D. Fortney

(57) ABSTRACT

A time-interleaved ADC mismatch correction method and time-interleaved ADC relating to the technical field of integrated circuits are disclosed. The time-interleaved ADC mismatch correction method and time-interleaved ADC solve problems with high-order filter modules and signal overflow or saturation risks. The applied technical scheme uses time-interleaved ADC output signal(s) and a fitted signal to calculate a set of filtering coefficients, and uses this set of filtering coefficients to correct the ADC output signal in real time. The applied technical scheme compensates for differences in the frequency response of each channel, rather than the frequency response itself, and the filter order is smaller, the implementation is simpler, and the circuit design complexity and device cost are greatly reduced. The technical solution has a wide range of adaptability, can correct and improve broadband interleaving performance, and avoids the signal overflow/saturation risk because the compensation range is small.

8 Claims, 4 Drawing Sheets

(56) References Cited

U.S. PATENT DOCUMENTS

| | | | | |
|---|---|---|---|---|
| 2014/0266823 | A1* | 9/2014 | Biallais | H03M 1/0607 341/118 |
| 2015/0263749 | A1* | 9/2015 | Ramakrishnan | H03M 1/0626 341/120 |
| 2015/0326240 | A1* | 11/2015 | Tousi | H03M 1/1038 341/118 |
| 2021/0159908 | A1* | 5/2021 | Singh | H03M 1/0626 |
| 2021/0409032 | A1* | 12/2021 | Bal | H03M 1/0836 |
| 2026/0005698 | A1* | 1/2026 | Kang | H03M 1/0604 |

* cited by examiner

TIME-INTERLEAVED ADC MISMATCH CORRECTION METHOD AND TIME-INTERLEAVED ADC

CROSS-REFERENCE TO RELATED APPLICATIONS

This application claims the benefit of Chinese Pat. Appl. No. 202410534724.8, filed on Apr. 30, 2024, incorporated herein by reference as if fully set forth herein.

TECHNICAL FIELD

This application relates to the technical field of integrated circuit design, especially to a time-interleaved analog-to-digital converter (TIADC), and specifically to a time-interleaved ADC mismatch correction method and a time-interleaved ADC.

BACKGROUND

High-speed analog-to-digital converters are one of the most challenging and difficult modules in integrated circuit design. They usually adopt a time-interleaved or time-multiplexed structure to improve conversion speed, reduce power consumption and realize complexity. The basic principle is to use M-channel sub-ADCs with a sampling rate of fs/M, operating alternately or in sequence in accordance with a uniform clock phase. The output data of each sub-ADC is synthesized or assembled by a multiplexer (MUX) in sequence to achieve the ADC function with a sampling rate of fs.

In high-speed ADCs with a time-interleaved architecture, the performance of the ADC is often restricted by errors resulting from mismatch among the channels. In particular, the errors arising from clock offset/mismatch and bandwidth mismatch, the amplitude of which is proportional to the operating frequency, can become a bottleneck or barrier in high-frequency applications.

There is a lot of research on interleaved circuit error correction. Bias and gain errors are generally easier to deal with and, because they are frequency-independent, generally do not become bottlenecks. However, the correction of clock offset and bandwidth mismatch is difficult, especially the latter, and there are few studies on the correction methods for high-frequency and large-bandwidth circuits.

FIG. 1 illustrates the correction of clock offset mismatch for a two-channel time-interleaved ADC, but the framework is also suitable for bandwidth mismatch correction. And $\varphi_1$ and $\varphi_2$ represent two channels of the clock, ideally with a half-cycle difference, to achieve the interleaving function. Since the clock of the two channels and the frequency response of the ADC may be mismatched, there may be interleaving errors caused by the resulting mismatched output.

Bandwidth mismatch in the frequency domain may manifests as an inconsistent frequency response in each channel. Taking the two-channel time-interleaved ADC as an example, the existing correction technology first interpolates the data of the two channels into the sampling rate fs of the entire ADC through a double interpolation module (↑2 in FIG. 1), and then passes the interpolated data through a filter module (F1 and F2 in FIG. 1, where channel 2 needs also passes through a delay module $Z^{-1}$ first) to compensate the frequency response of each channel. Therefore, the bandwidth mismatch between channels can be eliminated and the output performance can improve.

For an M-channel time-interleaved ADC, it is only necessary to replace the clock signal for each channel in FIG. 1 with M clocks with an intervening phase shift of fs/M, and change the interpolation module from ↑2 to ↑M.

The time-interleaved ADC mismatch correction method of the prior art can correct bandwidth mismatch and clock mismatch to a certain extent, but there are some problems. The main ones are:

1. Each filter module compensates for the frequency response of the entire channel. For the actual system, the frequency response is often more complex, requiring a higher filter order, greatly increasing circuit complexity and design difficulty, and resulting in soaring device costs.
2. As ADC gains tend to decrease at high frequencies, in order to compensate the channel frequency response, the frequency compensation module may increase signal power at high frequencies. In this way, if the high frequency ADC receives a large signal, it may cause signal overflow or saturation after the frequency compensation module.

SUMMARY

The main purpose of this application is to provide a time-interleaved ADC mismatch correction method and a time-interleaved ADC to solve problems in the prior art with high-order filter modules and the risks of signal overflow or saturation.

To achieve the above purposes, a time-interleaved ADC mismatch correction method is disclosed according to one aspect of the embodiments of this application, which comprises the following steps:

a. Receiving an input signal in a time-interleaved (or time-multiplexed) ADC for quantization (e.g., quantizing the input signal) to obtain an output signal x[n] (e.g., an ADC output signal), and transmitting the output signal to a fitting module to obtain a fitted signal $x_g[n]$;

b. Taking a difference between the fitted signal $x_g[n]$ and an the output signal x[n] as an error signal $x_e[n]$;

c. Inputting the output signal x[n] into a correction module containing a finite impulse response (FIR) filter having M channels (e.g., for processing, such as filtering the output signal x[n]), and then combining an output signal (e.g., a filtered output signal) of each of the M channels of the correction module to obtain an error estimation signal $y_e[n]$;

d. Calculating one or more filtering coefficients for the FIR filter according to the error estimation signal $y_e[n]$ and the error signal $x_e[n]$;

e. Adjusting the error estimation signal $y_e[n]$ using the filtering coefficient(s);

f. Iterating steps c to e until the error estimation signal $y_e[n]$ meets one or more design requirements (e.g., a predetermined value or condition); and g. Combining the error estimation signal $y_e[n]$ meeting the design requirements with the output signal x[n] to obtain a corrected and/or final output signal y[n].

In this method, M is the number of sub-ADCs in the time-interleaved ADC, and M is an integer>1.

In some embodiments, the input signal is a sinusoidal and/or analog signal.

In other or further embodiments, the fitted signal is a sinusoidal fitted signal satisfying the equation:

$$x_g[n] = A\sin(\Phi * n + \varphi),$$

wherein $x_g[n]$ is the sinusoidal fitted signal, A is the amplitude of the sinusoidal signal, Φ is the frequency of the sinusoidal signal, φ is the initial phase of the sinusoidal signal, and n is a time sequence of the digital signal (e.g., n is a period of the ADC output signal x[n]).

In some embodiments, the fitting module produces the fitted signal $x_g[n]$ according to an error function $f(A, \Phi, \varphi)=x_g[n]-x[n]$, where $x_g[n]=A_0(\Phi_0*n+\varphi_0)$, and $A_0$, $\Phi_0$ and $\varphi_0$ are found by a Nelder-Mead search algorithm to minimize $f(A, \Phi, \varphi)^2$.

To achieve the above purposes, another aspect of this application concerns a time-interleaved (or time-multiplexed) ADC, comprising M sub-ADCs, wherein the sub-ADCs operate in a time-interleaved mode and provide or output an output signal x[n], M correction modules, a fitting module, a subtraction module, a parameter estimation module, a merging module and an adding module. The M correction modules each comprise a finite impulse response (FIR) filter and a compensation module in series.

In the time-interleaved ADC, the fitting module fits the output signal x[n] to obtain a fitted signal $x_g[n]$;

The fitted signal $x_g[n]$ and the output signal x[n] are input into the subtraction module to obtain an error signal $x_e[n]$;

The output signal x[n] is input into the M correction modules (e.g., for processing), and output signals of the M correction modules are input into the merging module for summing to obtain an error estimation signal $y_e[n]$;

The error estimation signal $y_e[n]$ and the error signal $x_e[n]$ are input into the parameter estimation module to calculate and/or obtain one or more filtering coefficients;

The filtering coefficient(s) adjust the error estimation signal $y_e[n]$ (e.g., by being received by the FIR filters, which may multiply a channel of the output signal x[n] by a corresponding filtering coefficient) until a difference between the error estimation signal $y_e[n]$ and the error signal $x_e[n]$ meets design requirements;

The error estimation signal $y_e[n]$ meeting the one or more design requirements and the ADC output signal x[n] are input into the addition module to combine them and obtain a corrected and/or final output signal y[n]; and M is the number of sub-ADCs of the time-interleaved ADC, and M is an integer>1.

In one embodiment, the input signal is a sinusoidal signal.

In another or a further embodiment, the fitted signal $x_g[n]$ is a sinusoidal fitted signal satisfying the equation:

$$x_g[n] = A\sin(\Phi * n + \varphi)$$

wherein A is the amplitude of the sinusoidal signal, Φ is the frequency of the sinusoidal signal, φ is the initial phase of the sinusoidal signal, n is the time sequence of the digital signal (e.g., n is a period of the output signal x[n]).

In some embodiments, the fitting module produces the fitted signal $x_g[n]$ according to an error function $f(A, \Phi, \varphi)=x_g[n]-x[n]$, where $x_g[n]=A_0(\Phi_0*n+\varphi_0)$, and $A_0$, $\Phi_0$ and $\varphi_0$ are found by a Nelder-Mead search algorithm and minimize a value of $f(A, \Phi, \varphi)^2$.

Based on the technical proposal of the present application and its further improvement(s) in certain exemplary embodiments, the present application has the following beneficial effects:

The technical scheme in this invention uses a time-interleaved (or time-multiplexed) ADC output signal and a fitting signal to calculate a set of filtering coefficients, and uses this set of filtering coefficients to correct the ADC output signal in real time. The technical scheme in this application compensates a difference in the frequency response of each channel (in some embodiments, as the only compensation), rather than compensate the frequency response itself, and its filter order (e.g., first-order vs. second-order, second-order vs. third-order, etc.) is lower, the implementation is simpler, and the circuit design complexity and device cost are greatly reduced. The present technical solution can fulfil the correction and improvement of broadband interleaved or multiplexed ADC performance, and the risk of signal overflow or saturation is avoided because the compensation range is small. In particular, a relatively simple sinusoidal signal is used as the input signal for fitting, and after obtaining the filtering coefficient, any input signal can be corrected through it, which further reduces the difficulty of mismatch correction, and increases the adaptability of the mismatch correction method in this application.

The following is a further explanation of this application in combination with the attached drawings and specific implementation methods. The additional aspects and advantages of this application will be partially given in the description below, and partially will become apparent from the description below, or will become known through the practice of this application.

BRIEF DESCRIPTION OF THE DRAWINGS

The drawings that form part of this application are used to provide further understanding of this application, and the specific embodiments, schematic embodiments and descriptions of this application are used to interpret this application and do not constitute limitations of this application. In the drawings:

FIG. 4A shows the frequency response of the two channels, and FIG. 4B shows the difference in frequency response between the two channels.

EMBODIMENTS

It should be noted that specific embodiments, exemplary embodiments, and features therein in this application may be combined without conflict. This application is described in detail with reference to the attached drawings and in conjunction with the following.

In order to enable those skilled in the art to better understand the application scheme, the following will be combined with specific embodiments of the application and the attached drawings, to give a clear and complete description of specific embodiments of the application and the technical scheme(s) in the exemplary embodiments. It is readily apparent that the application is not limited to the exemplary embodiments described herein, but extends beyond the described embodiments. Based on the specific embodiments and exemplary embodiments in this application, all other embodiments and embodiments obtained by ordinary skilled personnel in the field without making creative labor shall fall within the scope of protection in this application.

Example

Figure 1:
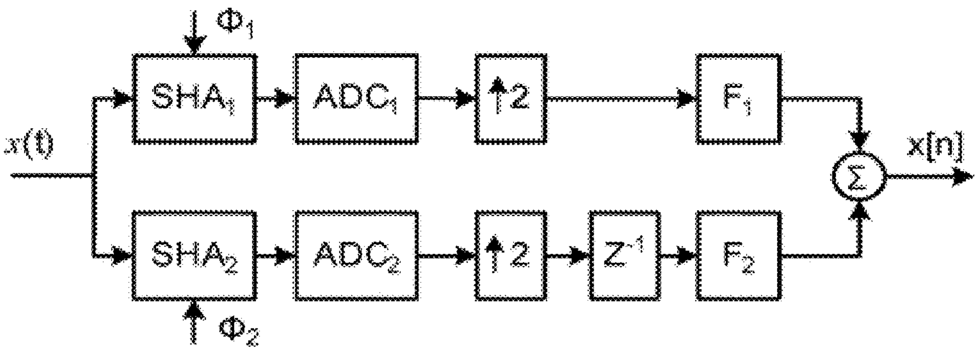
FIG. 1 shows a signal flow and/or circuit diagram of a prior mismatch correction method.
Figure 2:
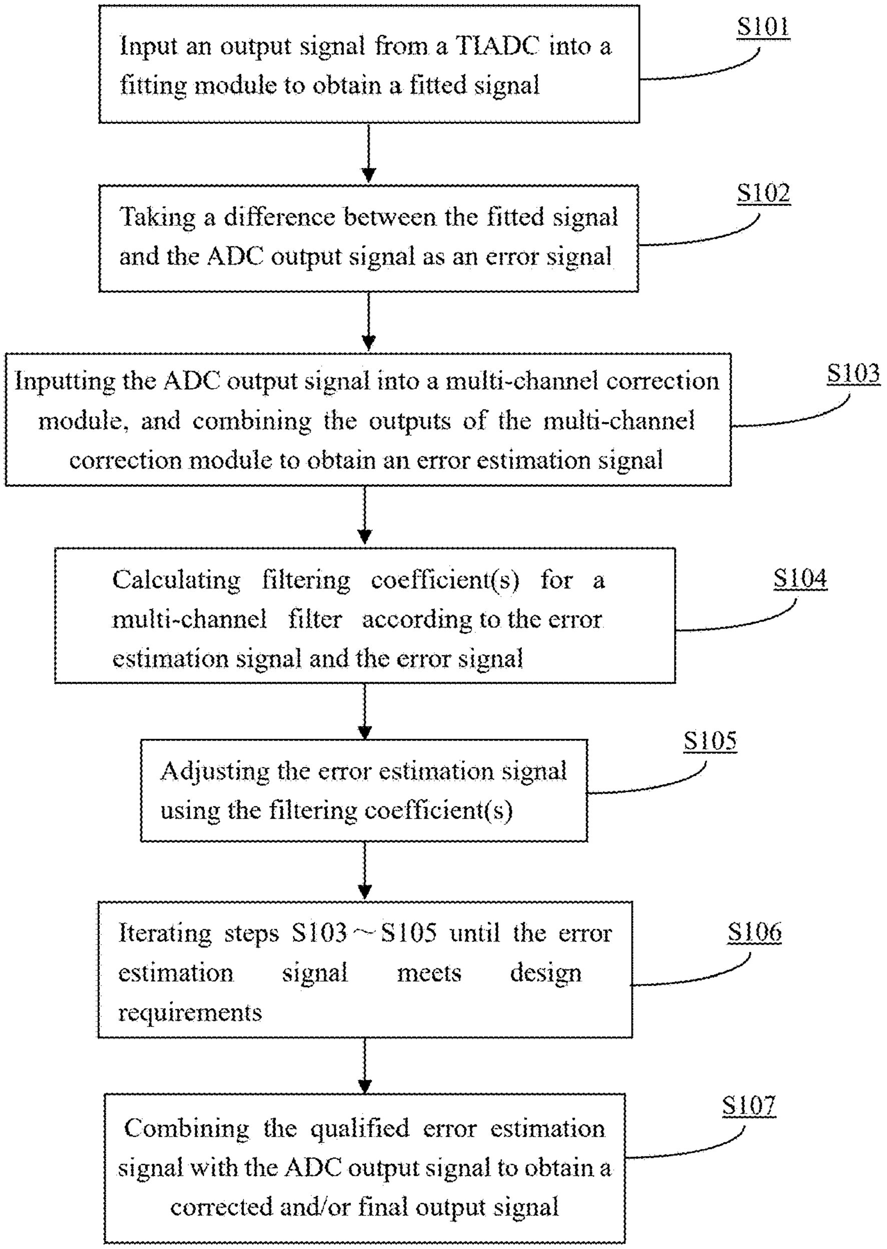
FIG. 2 shows an exemplary flow diagram of an embodiment of the mismatch correction method in this application.
Figure 3:
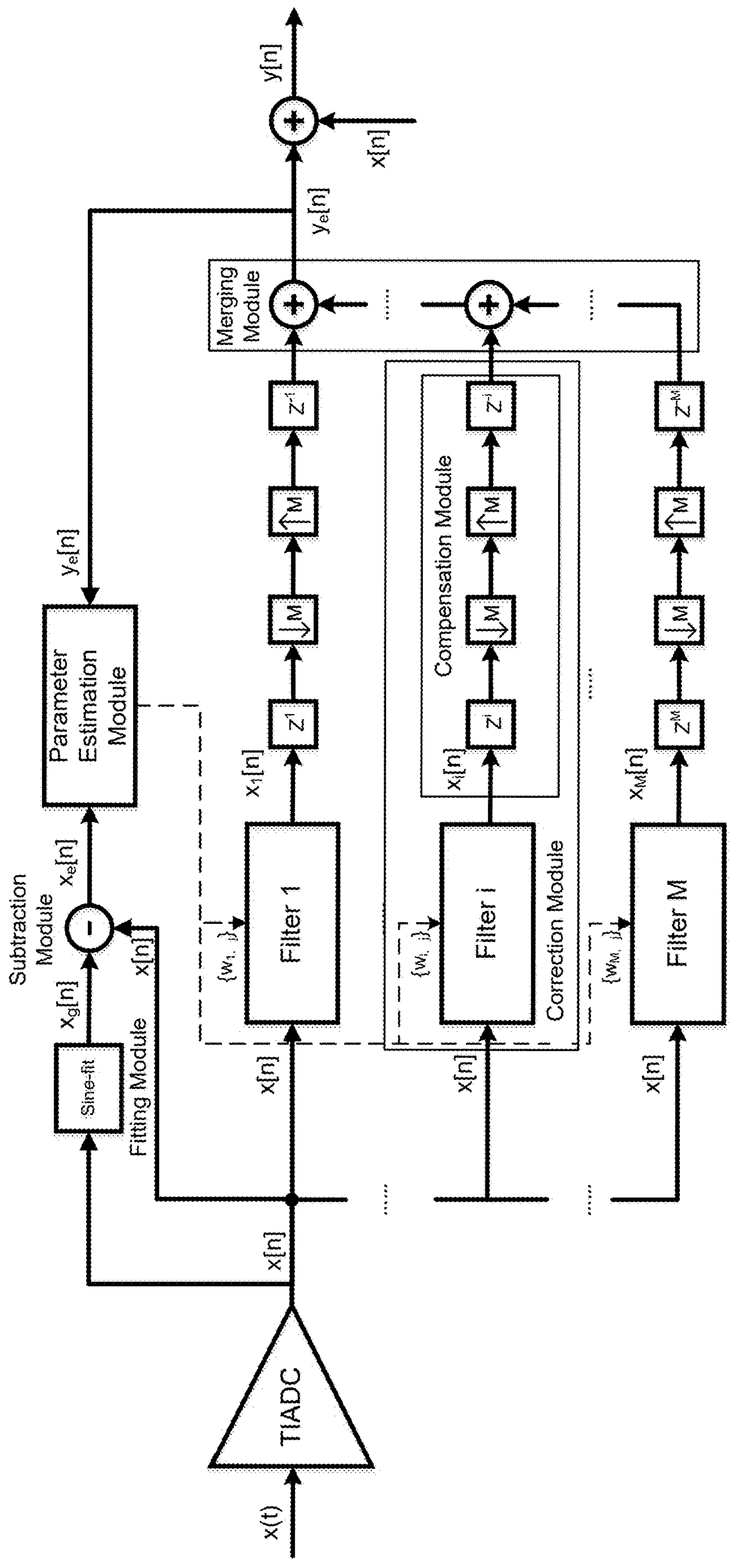
FIG. 3 shows an exemplary time-interleaved ADC structure and signal flow diagram of one or more embodiments of this application.

Referring to FIGS. 2 and 3, the main process(es) and implementation principle(s) of the time-interleaved ADC mismatch correction method for this example are described in detail as follows:

Step S101: Receive the input signal in a time-interleaved ADC for quantization processing (e.g., for analog-to-digital conversion) to obtain an output signal x[n], and input the output signal x[n] into a fitting module to obtain a fitted signal $x_g[n]$.

In this example, an input sinusoidal (e.g., analog) signal x(t) passes through an M-channel time-interleaved ADC to obtain the ADC output (e.g., digital) signal x[n]. Due to mismatch between the channels, the output signal x[n] may deviate from the ideal sinusoidal signal. In order to get the correction target, that is, the ideal sinusoidal signal, the output signal x[n] is passed through a sine-fit module, which functions to fit the output signal x[n] to the ideal sinusoidal signal (that is, to obtain the fitted signal $x_g[n]$).

Step S102: Take the difference between the fitted signal $x_g[n]$ and the ADC output signal x[n] as the error signal $x_e[n]$.

Figure 4B:
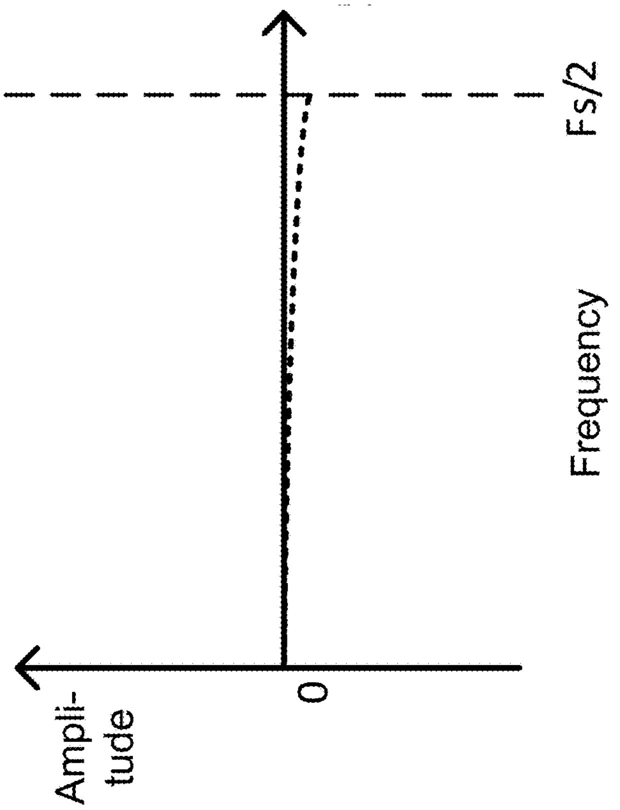
FIGS. 4A-B show the amplitude-frequency response curves of the first Nyquist domain of two channels of the time-interleaved ADC in one or more embodiments of this application. Among them.
Figure 4A:
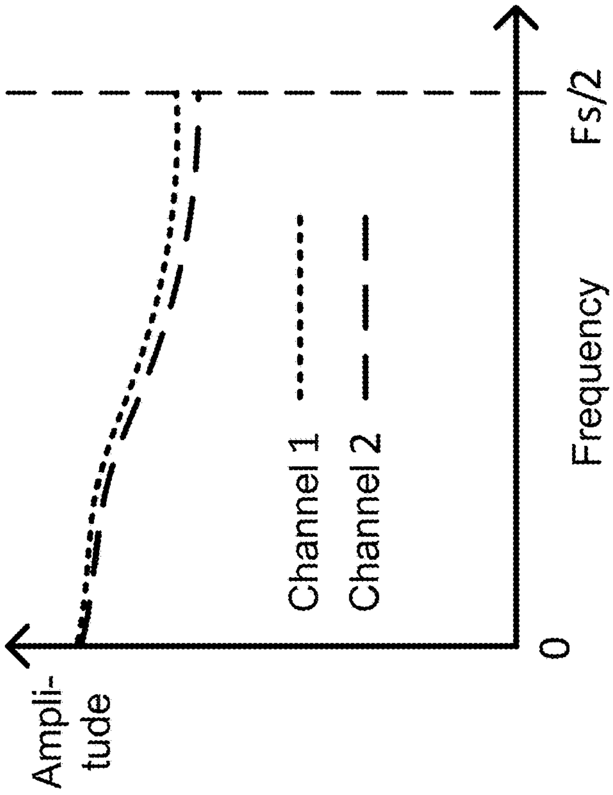

According to principles of Nelder-Mead search algorithms (e.g., a non-gradient optimization algorithm for solving unconstrained optimization problems), an ideal sinusoidal signal with error can be fitted from a sinusoidal signal (e.g., the ADC output signal x[n]). The approximate amplitude and frequency of the sinusoidal signal can be found by a fast Fourier transform (FFT), and $x_g[n]=A\sin(\Phi*n+\varphi)$ is defined, wherein A is the amplitude of the sinusoidal signal, Φ is the frequency of the sinusoidal signal, φ is the initial phase of the sinusoidal signal, and n is the time sequence of the digital signal (e.g., the period of the ADC output signal x[n]). Then, a function to define the error (e.g., the difference between the fitted signal $x_g[n]$ and the ADC output signal x[n]) is $f(A, \Phi, \varphi)=x_g[n]-x[n]$. In this error function, $x_g[n]=A_0\sin(\Phi_0*n+\varphi_0)$, where $A_0$, $\Phi_0$, and $\varphi_0$ can be found by the Nelder-Mead search algorithm, and $A_0$, $\Phi_0$, and $\varphi_0$ minimize $[f(A, \Phi, \varphi)]^2$. Consequently, $x_e[n]=x_g[n]-x[n]$ is the difference between x[n] and the ideal sinusoidal signal. This error may be caused by a mismatch between two or more of the channels 1 through M. Because each ADC channel is designed exactly the same, the difference(s) in frequency response among the channels is often small, so $x_e[n]$ may be quite small compared to x[n]. In FIG. 4A, the horizontal coordinates represent the frequency (where only the first Nyquist domain is drawn), the vertical coordinates represent the amplitude response of the channel, and the two curves respectively represent the frequency response of the two channels. FIG. 4B shows the difference in the frequency response of the two channels, indicating that the difference in the frequency response is much easier to compensate than the frequency response itself. So, if the correction module (FIG. 3) can pass the input x[n] through the filter and approximate $x_e[n]$, then x[n] can be corrected to an ideal (or substantially ideal) sinusoidal signal by the equation $x_g[n]=x[n]+x_e[n]$, equivalent to the function implemented by the subtraction module. Such filters require a smaller order of filter than those required to compensate the channel frequency response, and because the amplitude of compensation is small, the risk of data overflow or saturation is avoided. When a set of filtering coefficients is obtained (e.g., from the parameter estimation module) according to the sinusoidal signal, any input signal x(t) can be corrected by this filter or set of filters.

Step S103: Process (e.g., filter) the ADC output signal x[n] in an M-channel correction module (e.g., containing M FIR filters), and then combine the output signal(s) of the M-channel correction module to obtain the error estimation signal $y_e[n]$.

In this example, the ADC output signal x[n] is processed by the M-channel correction module containing M finite impulse response (FIR) filters, to obtain M single-channel filtered signals $x_i[n]$(i=1, 2 . . . . M). The single-channel filtered signals $x_i[n]$ pass through the corresponding compensation modules, and then the output signals of the M single-channel correction modules are merged in (e.g., added or summed by) the merging module to obtain the error estimation signal $y_e[n]$.

Step S104: Calculate one or more filter coefficients for a multi-channel FIR filter according to the error estimation signal $y_e[n]$ and the error signal $x_e[n]$.

In this example, the parameter estimation module performs an adaptive calculation according to the error estimation signal $y_e[n]$ and the error signal $x_e[n]$, and provides filtering coefficients $w_{i,j}$, wherein i is the channel number or filter index (which distinguishes the filter coefficients for different channels), j is the filter coefficient (for which different numbers or values represent different corrections), and the number refers to or is related to the filter order.

Step S105: Adjust the error estimation signal $y_e[n]$ using the filtering coefficient(s).

In this example, the filter coefficients $w_{i,j}$ are used to correct, adjust or modify the single-channel filtered signals $x_i[n]$ output from each single channel FIR filter, so as to adjust the error estimation signal $y_e[n]$.

Step S106: Iterate steps S103 to S105 until the error estimation signal $y_e[n]$ meets design requirements.

As shown in FIG. 3, each single-channel filter output signal $x_i[n]$ is corrected by a corresponding filtering parameter $w_{i,j}$, and then the merging module outputs the error estimation signal $y_e[n]$. After the error estimation signal $y_e[n]$ is input into the parameter estimation module, the filtering parameter $w_{i,j}$ may change in the calculation(s) performed by the parameter estimation module. A change in $w_{i,j}$ in turn corrects or updates one or more of the single-channel filter output signals $x_i[n]$. This enables cyclic iterations, and can move or converge the error estimation signal $y_e[n]$ to meet design requirements (e.g., for TIADC correction). For example, one possible design requirement is one in which $(y_e[n]-x_e[n])^2$ is below a predetermined value (e.g., see below), to qualify as meeting the requirement.

Step S107: Combine the qualified error estimation signal $y_e[n]$ with the ADC output signal x[n] to obtain the corrected and/or final output signal y[n].

Through the above iterative process, the error estimation signal $y_e[n]$ gradually qualifies to meet design requirements. The qualified error estimation signal $y_e[n]$ and the ADC output signal x[n] are input into an addition module (FIG. 3) to merge or be summed, to obtain the final output signal y[n]

that qualifies and/or meets the design requirements, so as to realize correction of any the mismatches (e.g., among channels) in the time-interleaved ADC.

FIG. 3 shows an exemplary M-channel time-interleaved ADC, including M sub-ADCs (not shown). The M sub-ADCs operate in time-interleaving mode (e.g., are time-multiplexed) to provide the TIADC output signal x[n].

In this example, the time-interleaved ADC is accompanied by multiple correction modules (e.g., one for each channel of the TIADC), a fitting module, a subtraction module, a parameter estimation module, finite impulse response (FIR) filters and compensation modules in series, a merging module and an adding module, as shown in FIG. 3 to form a correctable TIADC. M is the number of sub-ADCs and/or channels, and M>1.

Among the multiple correction modules in this example, each correction module includes a FIR filter, that is, a finite impulse response filter, also known as a non-recursive filter (hereinafter referred to as a filter). Each filter has the same structure and can be reused, but one difference among the filters is that the filter coefficient of each filter is different. In some embodiments, the k-th filter is equivalent to an inverse model of a k-channel sub-ADC channel mismatch (e.g., in which there is mismatch among the sub-ADCs in k channels, where k is an integer≥2, but <M), and its function is to offset any mismatch caused by the channel response.

As shown in FIG. 3, $Z^i$ in the compensation module represents i bits of digital signal advancement, $Z^{-i}$ represents i bits of digital signal delay, ↑M represents M a digital signal interpolation block (e.g., in which the signal is up-sampled M times), and ↓M represents a digital signal extraction block (e.g., in which the signal is down-sampled M times).

When the signal input to the i-th filter is x[n], the expression of the output signal $x_i[n]$ from the filter is:

$$x_i[n] = \sum_{k=-N}^{N} x[n-k] * w_{i,N+1-k} + w_{i,0}$$

N is the filter depth, and the order of the filter is 2N+1. The terms $w_{i,1}$ to $w_{i,2N+1}$ and $w_{i,0}$ are the filter coefficients, which are calculated adaptively in the parameter estimation module, and among which $w_{i,1}$ to $w_{i,2N+1}$ (corresponding to $w_{i,j}$, where j=1, 2 . . . 2N+1) compensate for the gain mismatch, clock shift and bandwidth mismatch of the i-th channel, and $w_{i,0}$ (corresponding to $w_{i,j}$, where j=0) compensates for the DC offset of the i-th channel. Since the filter order 2N+1 can be adjusted, the structure can better simulate the channel mismatch at any bandwidth by changing N. The output $x_i[n]$ of the i-th filter may successively pass through an i-th bit advance module (e.g., first delay module $Z^i$), an extraction module (which may extract the delayed filter output signal M times, or include M taps), an interpolation module (which may interpolate the extracted, delayed filter output signal M times, or also include M taps) and i-th bit delay module (e.g., second delay module $Z^i$), and be combined with the output of other single-channel correction modules to form the error estimation signal $y_e[n]$. As an example of a four-channel interleaved ADC, if the output of the i-th filter is $x_i[n]=[a^i\ b^i\ c^i\ d^i\ e^i\ f^i\ g^i\ h^i \ldots]$, after it passes the extraction module (e.g., a time-shift and difference extraction module) and is combined with corresponding signals from other channels, then one obtains $y_e[n]=[a^1\ b^2\ c^3\ d^4\ e^1\ f^2\ g^3\ h^4 \ldots]$.

In this example, the parameter estimation module may use a standard least mean square (LMS) algorithm to calculate the coefficient $\{w_i\}$ of the filter(s). Here, $J=(x_e[n]-y_e[n])$ may represent or be used as the error of the LMS algorithm, and a gradient method may be used to iterate the coefficient (e.g., according to the following equation):

$$w_{i,k}^{m+1} = w_{i,k}^{m} - \alpha \frac{\partial J^m}{\partial w_{i,k}^m}$$

The error J can (and preferably should) approach 0. In the above equation, $$w_{i,k}^{m}$$

is the filter coefficient obtained after the m-th iteration, and α is a selected step size value, the purpose of which is to ensure the convergence of the algorithm. Generally, a small value, such as 0.01 is chosen (e.g., as a design requirement). $J^m$ represents the error after the m-th iteration. After each iteration, these coefficients are fed back to the filter to generate an updated error estimation signal $y_e[n]$ (e.g., after an[m+1]-th iteration). Initial coefficients can be selected as $$w_{i,N+1}^{0} = 1$$

and $$w_{i,j}^{0} = 0,$$

where j≠N+1.

Figure 5A:
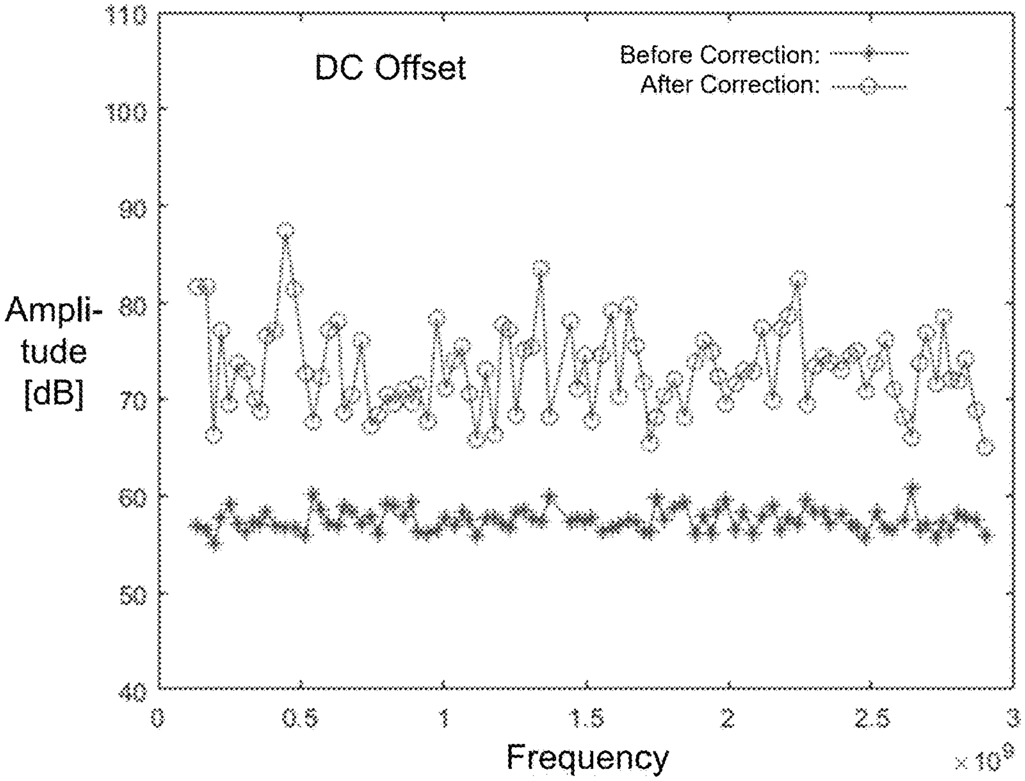
FIGS. 5A-B are graphs of the verification results of the technical scheme in this application on a high-speed ADC.
Figure 5B:
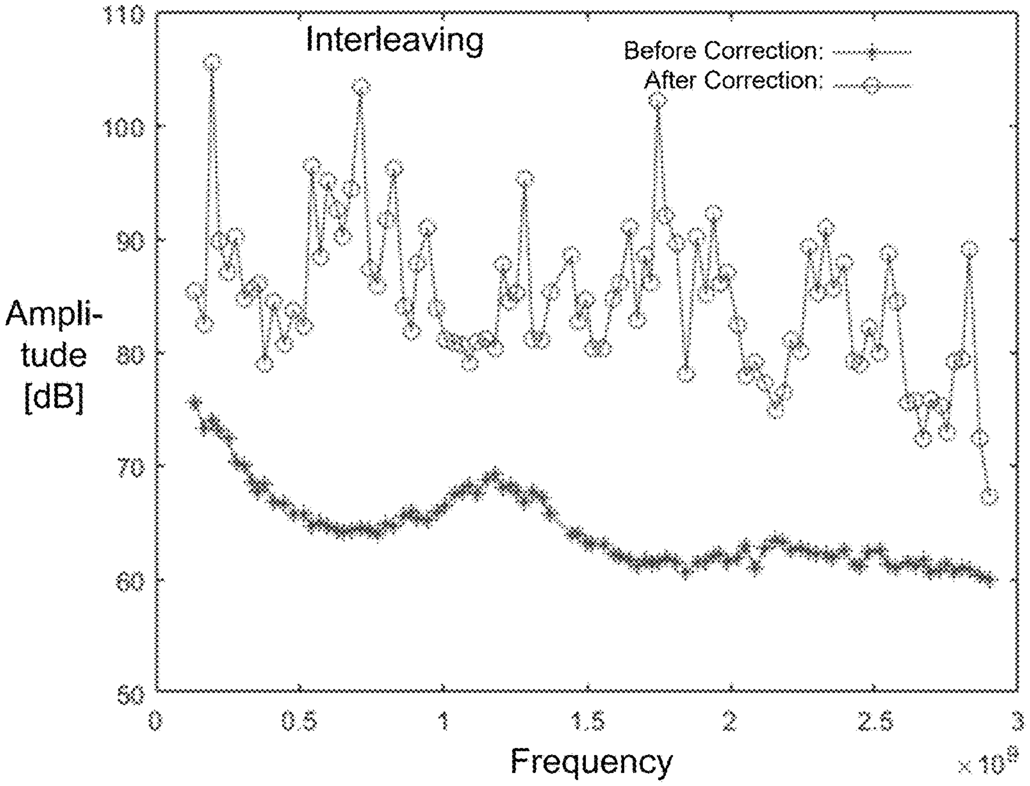

FIGS. 5A-B show the verification results of the proposed technical scheme on a high-speed ADC with a sampling rate of 6 gigasamples per second (Gsps) and an 8-channel time-interleaved structure. The sinusoidal signal used for training the filtering coefficients is 94 monophonic signals in the range from 134 MHz to 2898 MHZ, and the frequency of each signal is randomly selected in this range. The range covers more than 90% of the first Nyquist domain. The filter order is selected as 23, that is, N=11. FIG. 5A shows the results for correction of the direct current (DC) offset mismatch, wherein the y-axis (ordinate) is the DC offset amplitude (defined here as signal[in dB] minus offset or error[in dB]). FIG. 5B shows the results of gain, clock, and bandwidth mismatch correction. It can be seen that the technical solution of this application has obvious improvement on most of the signals in the Nyquist domain.

What is claimed is:

1. A time-interleaved ADC mismatch correction method, comprising:

a. receiving an input signal in a time-interleaved ADC for quantization and obtaining an output signal x[n], and inputting the output signal x[n] into a fitting module to obtain a fitted signal $x_g[n]$;

b. taking a difference between the fitted signal $x_g[n]$ and the output signal x[n] as an error signal $x_e[n]$;

c. inputting the output signal x[n] into a multi-channel correction module containing a plurality of finite impulse response (FIR) filters, and then combining an output signal of each channel of the multi-channel correction module to obtain an error estimation signal $y_e[n]$;

d. calculating one or more filtering coefficients for the FIR filters according to the error estimation signal $y_e[n]$ and the error signal $x_e[n]$;

e. adjusting the error estimation signal $y_e[n]$ using the one or more filtering coefficients;

f. iterating inputting the output signal x[n] into the multi-channel correction module, calculating one or more filtering coefficients, and adjusting the error estimation signal $y_e[n]$ until the error estimation signal $y_e[n]$ meets one or more design requirements, and g. combining the error estimation signal $y_e[n]$ meeting the one or more design requirements with the output signal x[n] to obtain a corrected and/or final output signal y[n], wherein M is a number of sub-ADCs in the time-interleaved ADC, and M is an integer>1.

2. The time-interleaved ADC mismatch correction method in claim 1, wherein the input signal is a sinusoidal signal.

3. The time-interleaved ADC mismatch correction method in claim 2, wherein the fitted signal $x_g[n]$ is a sinusoidal fitted signal satisfying the equation:

$$x_g[n] = A\sin(\Phi * n + \varphi)$$

wherein A is an amplitude of the sinusoidal signal, Φ is a frequency of the sinusoidal signal, φ is an initial phase of the sinusoidal signal, and n is a period of the output signal x[n].

4. The time-interleaved ADC mismatch correction method in claim 3, wherein the fitting module produces the fitted signal $x_g[n]$ according to an error function $f(A, \Phi, \varphi)=x_g[n]-x[n]$, wherein $x_g[n]=A_0(\Phi_0*n+\varphi_0)$, and $A_0$, $\Phi_0$ and $\varphi_0$ are found by a Nelder-Mead search algorithm and minimize $f(A, \Phi, \varphi)^2$.

5. A time-interleaved ADC, comprising M sub-ADCs, M correction modules, a fitting module, a subtraction module, a parameter estimation module, a merging module and an adding module, wherein;

the M sub-ADCs operate in a time-interleaved mode and output an output signal x[n], each of the M correction modules comprises a finite impulse response (FIR) filter and a compensation module in series, the fitting module fits the output signal x[n] to obtain a fitted signal $x_g[n]$, the fitted signal $x_g[n]$ and the output signal x[n] are input into the subtraction module to obtain an error signal $x_e[n]$, the output signal x[n] is input into the M correction modules, and output signals of the M correction modules are input into the merging module for summing to obtain an error estimation signal $y_e[n]$, the error estimation signal $y_e[n]$ and the error signal $x_e[n]$ are input into a parameter estimation module to calculate and/or obtain one or more filtering coefficients;

the one or more filtering coefficients adjust the error estimation signal $y_e[n]$ until a difference between the error estimation signal $y_e[n]$ and the error signal $x_e[n]$ meets one or more design requirements;

the error estimation signal $y_e[n]$ meeting the one or more design requirements and the output signal x[n] are input into the addition module to obtain a corrected and/or final output signal y[n], and M is an integer>1.

6. The time-interleaved ADC in claim 5, wherein the input signal is a sinusoidal signal.

7. The time-interleaved ADC in claim 6, wherein the fitted signal $x_g[n]$ is a sinusoidal fitted signal satisfying the equation:

$$x_g[n] = A\sin(\Phi * n + \varphi)$$

wherein A is an amplitude of the sinusoidal signal, Φ is a frequency of the sinusoidal signal, φ is an initial phase of the sinusoidal signal, n is a period of the output signal x[n].

8. The time-interleaved ADC in claim 7, wherein the fitting module produces the fitted signal $x_g[n]$ according to an error function $f(A, \Phi, \varphi)=x_g[n]-x[n]$, wherein $x_g[n]=A_0(\Phi_0*n+\varphi_0)$, and $A_0$, $\Phi_0$ and $\varphi_0$ are found by a Nelder-Mead search algorithm and minimize $f(A, \Phi, \varphi)^2$.

* * * * *